US005365643A

United States Patent [19]

Fujimoto

[11] Patent Number: 5,365,643

[45] Date of Patent: Nov. 22, 1994

[54] INK JET PRINTING HEAD PRODUCING METHOD

[75] Inventor: Hisayoshi Fujimoto, Kyoto, Japan

[73] Assignee: Rohm Co., Ltd., Kyoto, Japan

[21] Appl. No.: 956,916

[22] Filed: Oct. 5, 1992

[30] Foreign Application Priority Data

Oct. 9, 1991 [JP] Japan ................................ 3-260917

[51] Int. Cl.[5] ........................................ H01L 41/22

[52] U.S. Cl. ................................ 29/25.35; 29/890.1

[58] Field of Search ........................ 29/25.35, 890.1; 346/140 R; 310/328, 330–333

[56] References Cited

U.S. PATENT DOCUMENTS

| | | | |
|---|---|---|---|
| 4,032,929 | 6/1977 | Fischbeck et al. | 346/140 |
| 4,158,847 | 6/1979 | Heinzl et al. | 346/140 |
| 4,189,734 | 2/1980 | Kyser et al. | 346/1.1 |
| 4,216,483 | 8/1980 | Kyser et al. | 346/140 |
| 4,368,476 | 1/1983 | Uehara et al. | 346/140 |
| 4,375,066 | 2/1983 | Herd | 346/140 |
| 4,502,058 | 2/1985 | Koto | 346/140 |
| 4,566,018 | 1/1986 | Nilsson | 346/140 |
| 4,584,590 | 4/1986 | Fischbeck | 346/140 |
| 4,641,153 | 2/1987 | Cruz-Uribe | 346/140 |
| 4,752,789 | 6/1988 | Maltsev | 346/140 |
| 4,879,568 | 11/1989 | Bartky et al. | 346/140 |
| 4,887,100 | 12/1989 | Michaelis et al. | 29/25.35 |
| 4,992,808 | 2/1991 | Bartky et al. | 346/140 |
| 5,003,679 | 4/1991 | Bartky et al. | 346/140 |
| 5,028,936 | 7/1991 | Bartky et al. | 346/140 |

FOREIGN PATENT DOCUMENTS

| | | |
|---|---|---|
| 0364136 | 9/1990 | European Pat. Off. . |
| 3438033 | 8/1986 | Germany . |
| 60-68963 | 2/1985 | Japan . |

OTHER PUBLICATIONS

IBM Technical Disclosure Bulletin vol. 23, No. 10 Mar. 1981.

*Primary Examiner*—Carl E. Hall
*Attorney, Agent, or Firm*—Wolf, Greenfield & Sacks

[57] ABSTRACT

A method of producing a printing head provided in an ink jet printer for jetting ink particles onto paper. A piezoelectric block is formed with a plurality of aligned curved through channels to be filled with ink. Each channel is formed with an electrode on its internal walls. Then, positive and negative voltages are applied to a pair of electrodes conforming one partition wall so as to cause a polarization of the partition wall present between the channels. A front plate having orifices for jetting the ink and a back plate having ink supply path are mounted on the front and rear sides of the piezoelectric block.

12 Claims, 10 Drawing Sheets

FIG. 9

| | | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|---|
| (I) | A | + | − | | | + | − | | | + | − | | | + | − | | | + | − |
| | B | | + | − | | | + | − | | | + | − | | | + | − | | | |
| | C | | | + | − | | | + | − | | | + | − | | | + | − | | |
| | D | | | | + | − | | | + | − | | | + | − | | | + | − | |
| (II) | E | + | − | | | + | − | | | + | − | | | + | − | | | + | − |
| | F | | + | − | | | + | − | | | + | − | | | + | − | | | |
| | G | | | + | − | | | + | − | | | + | − | | | + | − | | |
| | H | | | | + | − | | | + | − | | | + | − | | | + | − | |

INK JET PRINTING HEAD PRODUCING METHOD

BACKGROUND OF THE INVENTION i) Field of the Invention

The present invention relates to a method for producing a printing head of an ink jet printer, and more particularly to a method for producing an ink jet printing head for jetting ink particles by varying the volume of an ink chamber.

ii) Description of the Related Arts

As is well-known, an ink jet printer for performing printing by jetting ink particles onto paper is used as an output terminal of a computer and is mounted on a variety of electronic devices such as a word processor, a facsimile machine or the like.

In the ink jet printer, jetting of ink is carried out by an ink jet printing head (hereinafter referred to as a printing head).

In the printing head, conventionally, various ink jet systems have been proposed.

For example, as one ink jet system, a so-called Caesar system has been developed, as disclosed in U.S. Pat. No. 4,189,734.

In this system, an ink chamber is filled up with ink, and a piezoelectric element is provided near the ink chamber. By applying a pulse voltage to the piezoelectric element, the piezoelectric element is deformed to reduce the volume of the ink chamber. With this volume reduction of the ink chamber, the ink is jetted from an orifice connected to the ink chamber.

However, in a conventional ink jet system represented by the Caesar system, it is difficult to perform a high density printing due to a constructional restriction. Further, since there is a limitation to the shortening of the length of the ink chamber, fluid friction tends to increase, and thus it is difficult to use a high viscous ink in order to obtain high quality.

On the other hand, with the spread of ink jet printer, a low cost printing head has been desired. Hence, a method capable of simply producing a printing head with high reliability has been increasingly in demand.

Relating to the present patent application, one U.S. patent application of a new system printing head has been filed (Japanese Patent Application Serial No.Hei 3-242184 corresponding to U.S. Ser. No. 07/897,381, E.P.C. Serial No. 92110158.0, Korean Patent Serial No. 10833). In this printing head, high density printing and high printing quality can be carried out.

This printing head includes a piezoelectric block formed with a plurality of ink chambers (hereinafter referred to as ink "channels") which are filled up with ink, aligned in parallel and formed to pass through the piezoelectric block. A plurality of electrodes are formed on the internal walls of the ink channels, a front plate is mounted onto the front side of the piezoelectric block and a back plate is mounted onto the rear side of the piezoelectric block. In this case, a polarization treatment is performed to the whole piezoelectric block in advance.

When the printing is carried out by using this printing head, a voltage is applied to one pair of adjacent electrodes properly selected, and then the partition walls of the ink channels are deformed to change the volumes of the ink channels. Thus, with the volume changes of the ink channels, the ink is jetted from an orifice formed in the front plate to perform a dot printing on the paper.

Next, a general producing method of this printing head described in the above-described application will now be described.

First, a polarization processing to the piezoelectric block is performed. This polarization processing, for example, is carried out by holding the piezoelectric block between a pair of electrodes for the polarization processing and applying a high voltage between the pair of electrodes. By this operation, a polarization is caused in the piezoelectric block.

Then, a plurality of ink channels are formed in the piezoelectric block by using a laser beam processing technique or the like.

Next, a plurality of electrodes are formed on the internal walls of the ink channels of the piezoelectric block by using a light exposure technique, an etching technique or the like.

After these processes, a front plate having a plurality of orifices for jetting the ink and a back plate having one ink supply path is secured to the piezo-electric block to obtain an ink jet printing head. The ink supply path supplies each channel with ink.

In such a conventional ink jet printing head producing method, usually, the polarization processing is executed in a heated state of 100° C. to 150° C. by applying an electric field having a strength of 2 to 3 KV/mm for 20 to 60 minutes.

Accordingly, for instance, when the printing head is a small serial head having a width of 5 mm, the polarization processing can be carried out by applying a voltage of 2 KV/mm×5 mm=10 KV.

In turn, when the printing head is a large line head having a width of 220 mm, it is required to apply a voltage of 2 KV/mm×220 mm=440 KV.

Therefore, in case of a printing head having a large width, in particular, a high voltage polarization processing is required, and it is also necessary to deal with a surface current caused on the surface of the piezoelectric material. Hence, an ink jet printing head producing method capable of performing a polarization processing at a low voltage is desired.

Further, in the aforementioned conventional general producing method, it is possible that the polarization disappears during the ink channel formation step and the electrode formation step after the polarization processing. That is, due to the heat generation by the laser beam processing, there is the possibility that the polarized state becomes unstable.

SUMMARY OF THE INVENTION

It is therefore an object of the present invention to provide an ink jet printing head producing method in view of the aforementioned problems of the prior art, which is capable of performing a polarization processing of a piezoelectric material at a low voltage.

It is another object of the present invention to provide an ink jet printing head producing method capable of avoiding the disappearance of polarization caused in a piezoelectric material and achieving a stable polarized state.

In accordance with one aspect of the present invention, there is provided a producing method of an ink jet printing head, comprising the steps of forming a plurality of aligned through channels to be filled with ink in a piezoelectric block of a piezoelectric material; forming an electrode on internal walls of each channel; applying positive and negative voltages to the electrodes of adjacent two channels to cause a polarization of a partition wall between the adjacent two channels; mounting a front plate having a plurality of orifices for jetting the ink onto a front side of the piezoelectric block; and mounting a back plate having a plurality of ink supply paths onto a rear side of the piezoelectric block.

According to the present producing method, after a plurality of channels and a plurality of electrodes are formed in a piezoelectric block, polarization processing can be performed for every partition wall by using the electrodes.

Therefore, according to the present invention, a high voltage polarization processing device is not required, and disappearance of the polarization due to laser beam heat processing or the like can be prevented.

BRIEF DESCRIPTION OF THE DRAWINGS

The objects, features and advantages of the present invention will become more apparent from consideration of the following detailed description, taken in conjunction with the accompanying drawings, in which:

FIG. 9 is an explanatory view showing voltage applying electrode line numbers for the polarization processing in the producing method according to the present invention.

DESCRIPTION OF THE PREFERRED EMBODIMENTS

Figure 1:
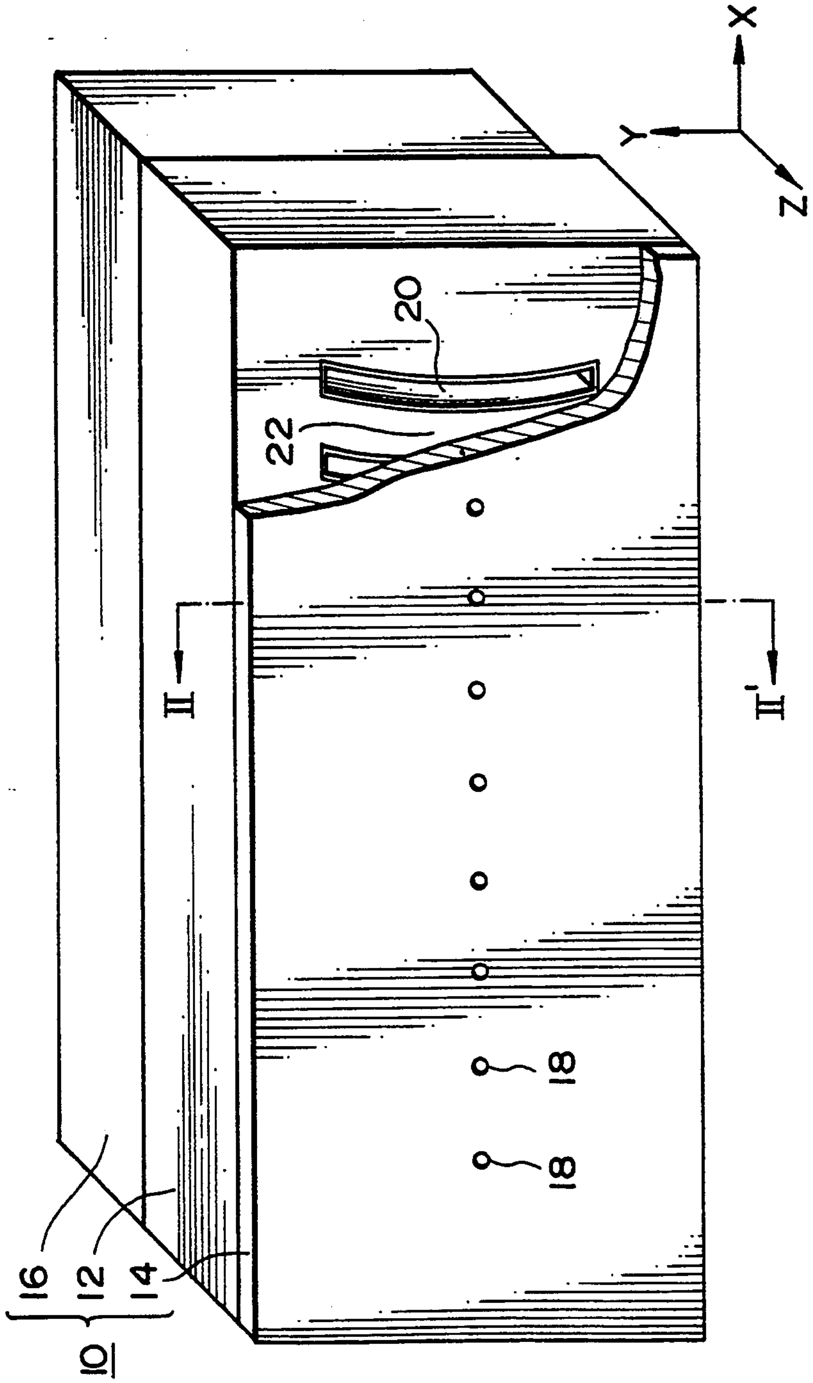
FIG. 1 is a schematic perspective view, partly in section, of an ink jet printing head produced by an ink jet printing head producing method according to the present invention.

The present invention will now be described in connection with its preferred embodiments with reference to the attached drawings, wherein like reference characters designate like or corresponding parts throughout the views and thus the repeated description thereof can be omitted for brevity. First, a structure of an ink jet printing head to be produced by a method according to the present invention will be described, and then the ink jet printing head producing method according to the present invention will be described.

Figure 2:
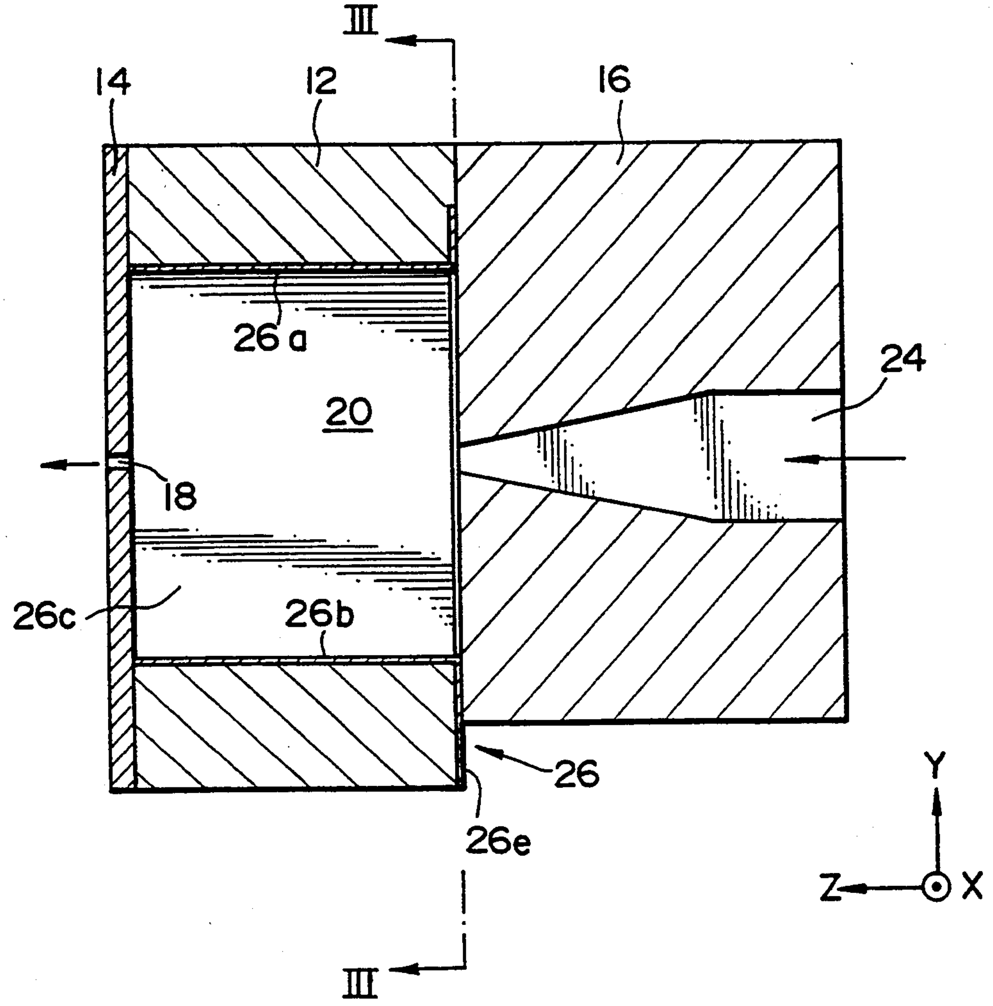
FIG. 2 is a cross section, taken along the line II—II shown in FIG. 1.
Figure 3:
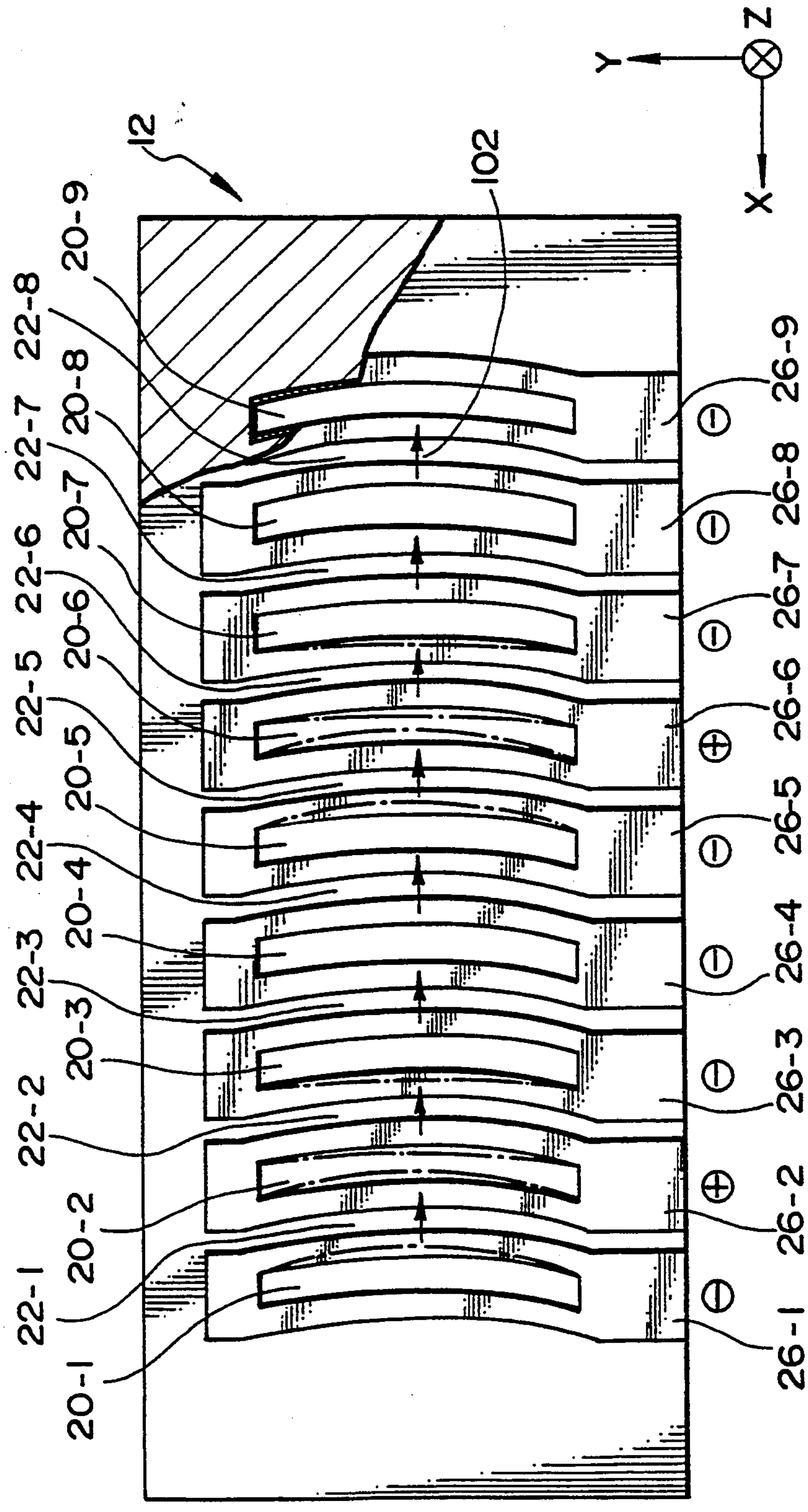
FIG. 3 is a rear view of a piezoelectric block seen from the direction III shown in FIG. 2.

(A) A structure of an ink jet printing head:

In FIGS. 1 to 3, there is shown an ink jet printing head 10 to be produced by an ink jet printing head producing method according to the present invention. The printing head producing method according to the present invention is suitable for producing this printing head 10 and is also applicable to the production of printing heads of other systems with partition walls of Ink channels requiring polarization processing.

As shown in FIG. 1, the printing head 10 is comprised of a piezoelectric block 12 composed of a piezoelectric material (PZT), a front plate 14 mounted onto a front side of the piezoelectric block 12 and a back plate 16 mounted onto a rear side of the piezoelectric block 12.

In this embodiment, as shown in FIG. 1, the front plate 14 is provided with a plurality of through orifices 18 for jetting ink particles, aligned along a line so as to form a printing head for a so-called line printer.

The piezoelectric block 12 is formed with a channel array therein. This channel array includes a plurality of channels 20 as an ink chamber to be filled up with an ink. The channels 20 are separated by partition walls 22 from one another. As clearly shown in FIG. 1 partly in broken, the channels 20 are curved to an array direction (−X-direction in FIG. 1).

FIG. 2 is a cross section, taken along the line II—II shown in FIG. 1. In FIG. 2, the height (a length in a Y-direction, for example, 1.2 mm) of each channel 20 is somewhat larger than the length (in a Z-direction, for example, 1.0 mm) of the same. The width (in the X-direction) of each channel 20 is determined to, for example, 0.1 mm.

Figure 7:
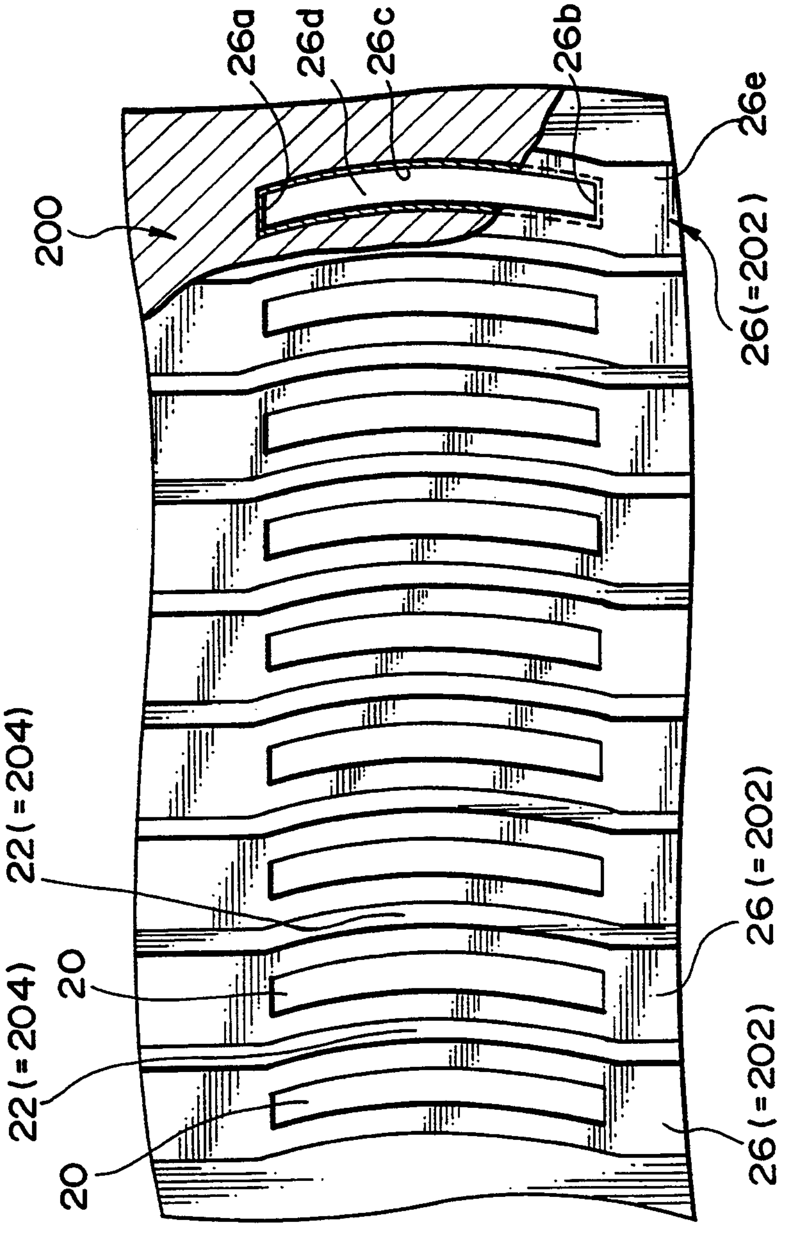
FIG. 7 is a fragmentary enlarged view showing a plurality of electrodes formed on the internal surfaces of the channels formed in the piezoelectric material shown in FIG. 6.

Each channel 20 is formed with an electrode 26 on its internal walls. Each electrode 26 is composed of electrode elements 26*a* and 26*b* formed on the upper and lower internal walls, electrode elements 26*c* and 26*d* formed on both the sides of the partition walls 22 and an electrode element 26*e* formed on the rear side of the piezoelectric block 12, as shown in FIG. 7. That is, the internal four walls of each channel 20 are covered by the electrode elements 26*a*, 26*b*, 26*c* and 26*d*, and in turn, the electrode element 26*e* formed on the rear side of the piezoelectric block 12 is used as an external terminal. In this case, a protecting film (not shown) is applied over the surface of the electrodes 26 but is not always necessary because the ink within the channels 20 is not conductive.

As shown in FIG. 2, the back plate 16 is formed with a ink supply path 24 leading to the channels 20.

FIG. 3 shows the rear side of the piezoelectric block 12, as seen from the direction III shown in FIG. 2. As shown in FIG. 3, nine channels 20-1 to 20-9 are formed so as to constitute the channel array in the piezoelectric block 12. Also, nine electrodes 26-1 to 26-9 are formed on the internal walls of the nine channels 2-1 to 20-9.

Further, as shown by arrows 102 in FIG. 3, the polarization of the partition walls 22-1 to 22-8 is caused in the −X-direction in the polarization processing step at the producing time.

When the printing is carried out by using this printing head, for instance, the voltage is applied to the electrodes 26 at the polarity shown in FIG. 3. Hence, as indicated by one-dotted lines in FIG. 3, parts of the 8 partition walls 22 are expanded or contracted depending on the electric field direction and the polarization direction. That is, the partition wall 22-1 is extended in the upper and lower direction (Y-direction) to increase the curved amount, and in turn, the partition wall 22-2 is contracted in the upper and lower direction to reduce the curved amount. As a result, the volume of the channel 20-2 formed by the partition walls 22-1 and 22-2 is temporarily reduced, and thus the ink pressure within the channel 20-2 is increased so as to jet the ink from the corresponding orifice 18 extending in the Z-direction, as shown in FIG. 1.

Similarly, the volume of the channel 20-6 conformed by the partition walls 22-5 and 22-6 is reduced to jet the ink from the corresponding orifice 18 in the same manner as described above.

In this case, as shown by the one-dotted lines in FIG. 3, as the volumes of the channels 20-2 and 20-6 are reduced, the volumes of the adjacent channels 20-1, 20-3, 20-5 and 20-7 are somewhat increased and thus the ink is supplied to these channels from the ink supply path 24.

After the partition walls 22-1, 22-2, 22-5 and 22-6 are sufficiently deformed, by disconnecting the applied voltage or reversing the polarity of the applied voltage, the deformed partition walls are restored to the original state, and the ink is filled up again into the channels 20-2 and 20-6.

(B) A production method of an ink jet printing head:

A production method of the above-described ink jet printing head will now be described in detail.

Figure 4:
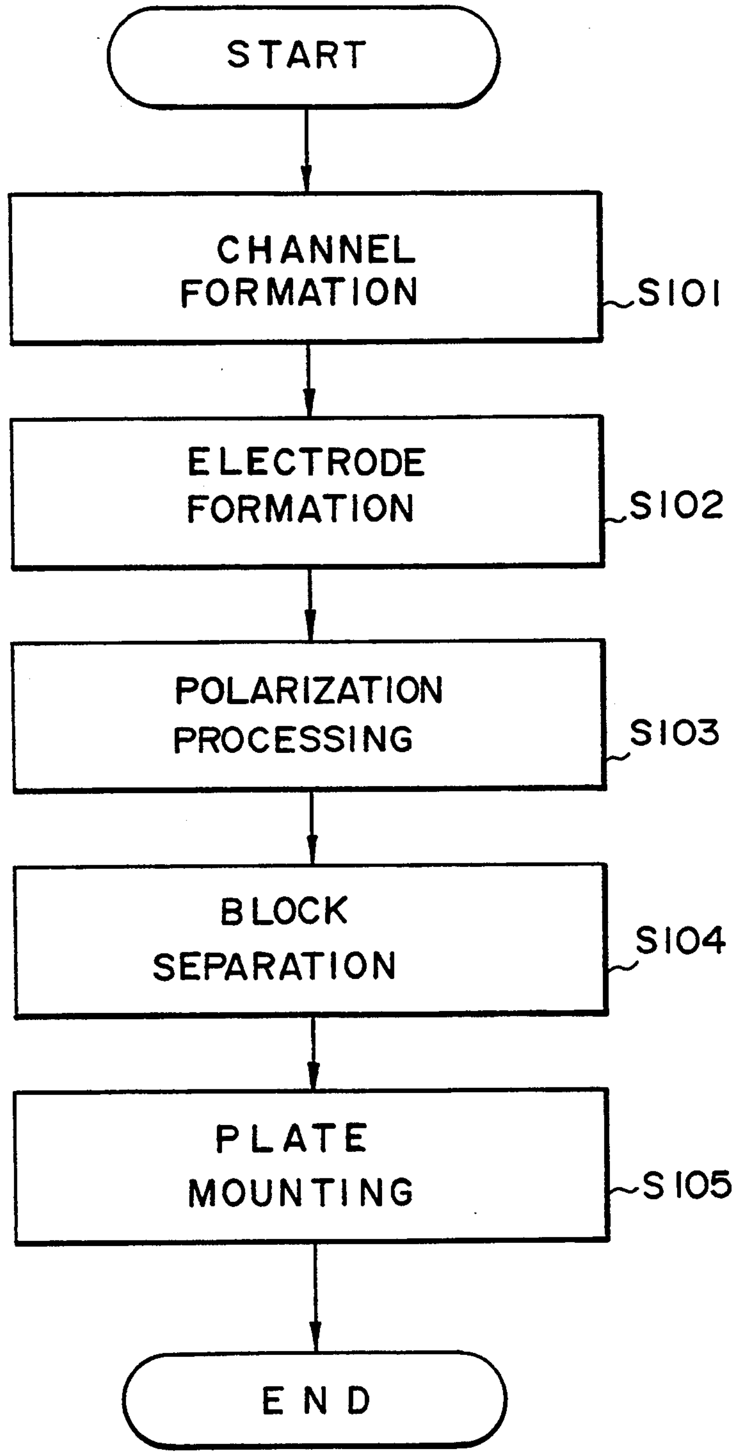
FIG. 4 is a flow chart showing an ink jet printing head producing method according to the present invention.

FIG. 4 shows a flow chart of one embodiment of a production method of an ink jet printing head according to the present invention. In this producing method, a plurality of printing heads can be produced at the same time.

Figure 5:
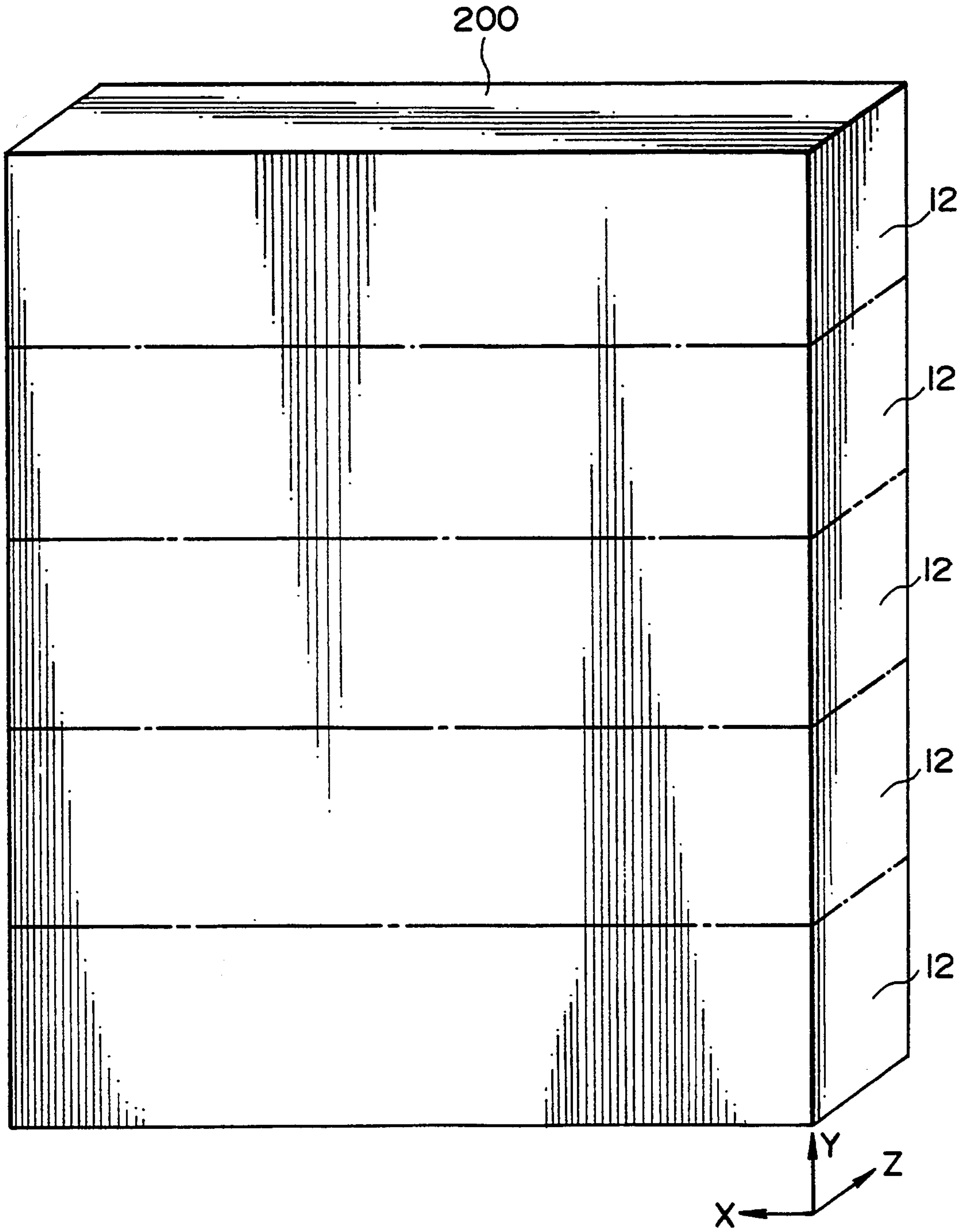
FIG. 5 is a perspective view of a piezoelectric material having a flat plate form, to be used in the producing method shown in FIG. 4.
Figure 6:
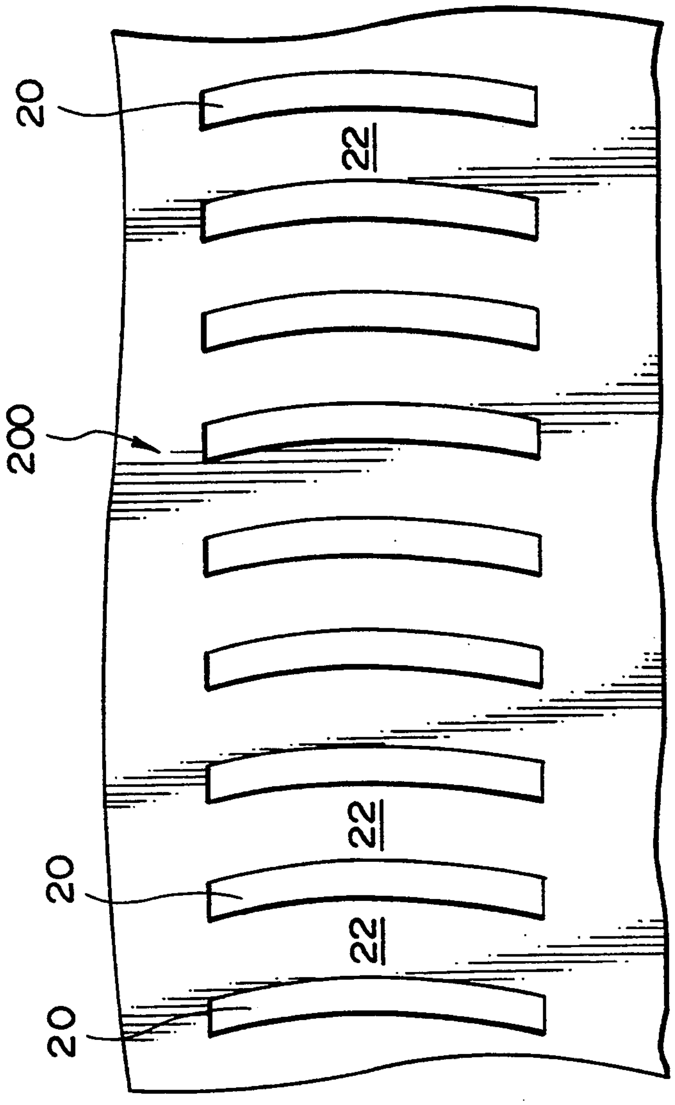
FIG. 6 is a fragmentary enlarged view showing a plurality channels formed in the piezoelectric material shown in FIG. 5.

First, in a channel formation step S101, as shown in FIG. 5, a piezoelectric material (PZT) 200 having a flat plate form for forming a plurality of piezoelectric blocks 12 is processed to form a plurality of curved through channels 20 in a matrix form. In FIG. 6, there is shown a part of the piezoelectric material 200 formed with the channels 20. This channel formation can be performed using a conventional method, for example, excimer laser beam processing, laser beam processing in a solution containing KOH or the like, press working, ultrasonic wave processing or the like can be used.

Figure 8:
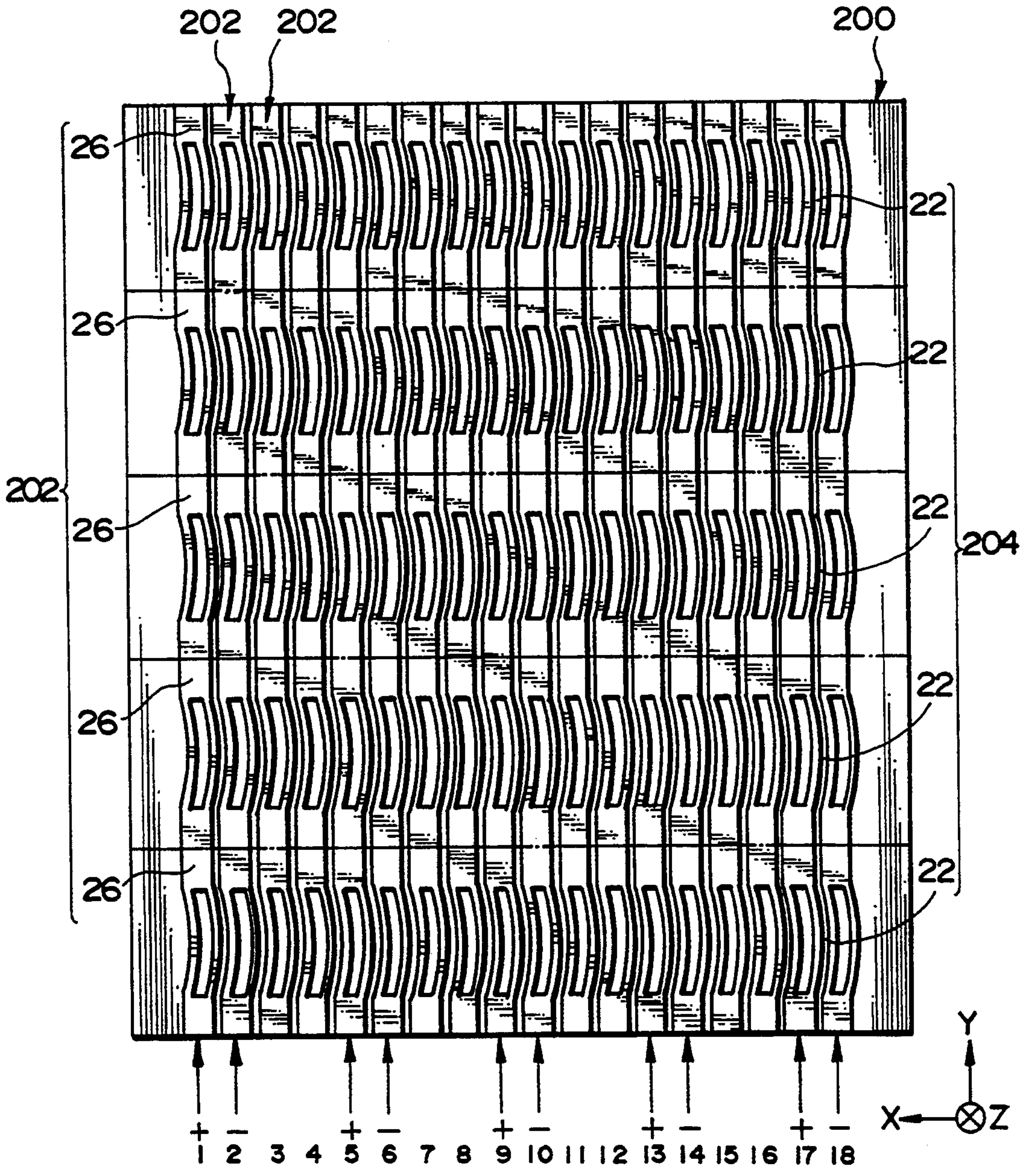
FIG. 8 is an elevational view of the piezoelectric material in which a plurality of channel arrays and a plurality of electrode lines are formed according to the present invention.

As described above, in step S101, a plurality of channel arrays are formed in the piezoelectric material 200. As shown in FIG. 8, each channel array is composed of a plurality of channels 20 aligned in series in the X-direction and a plurality of channel arrays are arranged in parallel in multistages in the Y-direction to form a channel array group. In the example shown in FIG. 8, different from the example shown in FIG. 3, each channel array is composed of 18 channels.

In an electrode formation step S102 shown in FIG. 4, as shown in FIG. 7, the channels 20 are formed with electrodes 26 on their internal walls by using a conventional method such as a light exposure technique, an etching technique or the like. Each electrode 26 is composed of four electrode elements *26a*, *26b*, *26c* and *26d* formed on the four internal walls of each channel and one electrode element *26e* formed on the rear side of the piezoelectric material 200.

In FIG. 8, there is shown the piezoelectric material 200 after the steps S101 and S102.

In this embodiment, as shown in FIG. 8, a plurality (five) of electrodes 26 aligned in parallel along each line in the Y-direction are connected in series to form one electrode line 202. That is, a plurality of electrodes 26 aligned in parallel in the Y-direction are still integrated in this state. Also, a plurality of partition walls 22 between the channels 20 are arranged in parallel at a predetermined interval in the Y-direction to form 17 partition wall columns 204 aligned in parallel in the X-direction.

In a polarization processing step S103 shown in FIG. 4, positive and negative voltages are applied to pairs of adjacent electrode lines 202. This state is shown in FIG. 8. In FIG. 8, the positive voltage is applied to the first, fifth, ninth, thirteenth and seventeenth electrode lines 202 and the negative voltage is applied to the second, sixth, tenth, fourteenth and eighteenth electrode lines 202.

When such a voltage application is carried out, the polarization processing of the first, fifth, ninth, thirteenth and seventeenth five partition wall columns 204 is performed. In this embodiment, as shown in FIG. 8, by applying the voltages to the predetermined pairs of adjacent electrode lines 202, the polarization processing of the 5 partition walls 22 can be performed at one time.

FIG. 9 shows the order of the voltage application to the adjacent electrode lines 202. In this case, steps (A) to (H) indicate progression of time and numerals (1) to (18) indicate the numbers of the electrode lines 202. The voltage application state shown in FIG. 8 corresponds to the step (A). In each step, the number of the pairs of the adjacent electrode lines 202 selected for the voltage application is one or more. However, for the electrode line pair selection, at least one electrode line must be present between the two selected adjacent electrode line pairs because the polarization in the reverse direction can be caused in the partition wall 22 between the two adjacent electrode line pairs and the generated polarization may disappear.

When the step (A) is finished, the step (B) is executed. In the step (B), the electrode lines 202 to which the voltages are to be applied are shifted by one to the right. This one line shift is repeated in order in the subsequent steps.

When one voltage application of the steps (A) to (D) of a stage (I) is carried out, the polarization can be generated in all partition walls. However, when the polarization amount is sufficient for only one polarization processing for each partition wall, another voltage application of the steps (E) to (H) of a stage (II) is executed. The steps (E) to (H) are the same as the steps (A) to (D). As described above, by performing a plurality of polarization processing steps, the polarization processing amount of the partition walls can be enlarged.

In the aforementioned polarization processing step S103, in the case of a thickness $t=0.1$ mm of the partition walls 22, the application voltage is $2\ KV/mm \times 0.1\ mm = 200$ V. Hence, the polarization processing at a low voltage can be realized. The voltage applying time and the heating temperature of the piezoelectric material 200 are the same as the conventional method, for example, 20 to 60 minutes and 100° to 150° C.

In a block separation step S104 shown in FIG. 4, as shown by one-dotted lines in FIG. 8, the piezoelectric material 200 is cut into a plurality (five) of channel arrays in the X-direction to obtain a plurality (five) of piezoelectric blocks 12.

In a plate mounting step S105 shown in FIG. 4, the front plate 14 and the back plate 16 are mounted to the front and rear sides of each piezoelectric block 12 (see FIG. 1 and FIG. 2).

As described above, in the steps S101 to S105, the printing head 10 can be produced.

Figure 10:
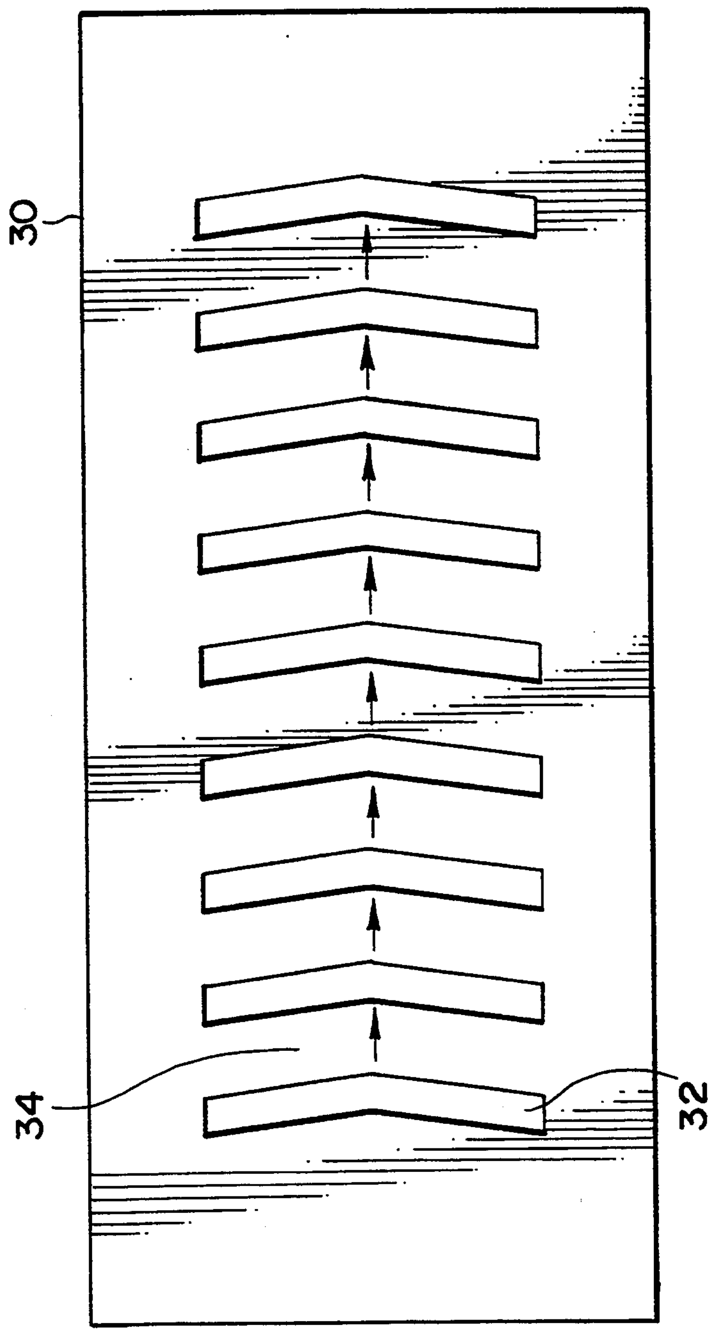
FIG. 10 is an elevational view of another channel array formed in the piezoelectric block in the producing method according to the present invention.

In FIG. 10, there is shown another piezoelectric block 30 formed with a plurality of V-shaped channels 32 separated by V-shaped partition walls 34. Of course, to such a piezoelectric block 30, the present printing head production method can be applied. Further, the printing head production method according to the present invention can be applied to any printing head having partition walls requiring the polarization processing for causing the deformation by the voltage application.

Although the 5 piezoelectric blocks are formed at the same time in the above-described embodiments, of course, the piezoelectric blocks can be produced one by one and more than 5 piezoelectric blocks can be produced at the same time to obtain the same effects as those obtained in the above-described embodiments.

As described above, according to the present printing head production method, the following effects can be obtained.

That is, since polarization processing can be directly performed to thin partition walls, the polarization processing at the low voltage can be realized. In particular, polarization processing at the low voltage can be carried out on a long piezoelectric block extending in the X-direction.

Further, since the polarization processing is carried out after the formation of the channels and the electrodes, the disappearance of the polarization state due to the formation processing can be avoided.

According to the above embodiment, since a plurality of piezoelectric blocks can be produced at the same time, the present producing method is suitable for mass production to enable a reduction of the production cost.

While the present invention has been described with reference to the particular illustrative embodiments, it is not to be restricted by those embodiments but only by the appended claims. It is robe appreciated that those skilled in the art can change or modify the embodiments without departing from the scope and spirit of the present invention.

What is claimed is:

1. A method of producing an ink jet printing head, comprising the steps of:
forming a plurality of aligned through channels, to be filled with ink, in a piezoelectric block of a piezoelectric material;
forming an electrode on internal walls of each channel;
applying positive and negative voltages to the electrodes of two adjacent channels to cause a polarization of a partition wall between the adjacent two channels;
mounting a front plate having a plurality of orifices for jetting the ink onto a front side of the piezoelectric block; and
mounting a back plate having an ink supply path onto a rear side of the piezoelectric block.

2. The method of claim 1, wherein the channels are curved in an array direction.

3. The method of claim 2, wherein an adjacent electrode pair to be applied with the positive and negative voltages is selected in order to cause the polarization of all partition walls in the same direction.

4. The method of claim 3, wherein a plurality of adjacent electrode pairs are simultaneously selected at one time.

5. The method of claim 4, wherein, when a plurality of adjacent electrode pairs are simultaneously selected, at least one electrode applied with no voltage is always present between adjacent electrode pairs.

6. The method of claim 5, wherein the polarization processing by the voltage application is performed at least two times in all partition walls.

7. A method of producing an ink jet printing head, comprising the steps of:
forming a plurality of multistage channel arrays aligned in a Y-direction, each channel array being composed of a plurality of through channels, to be filled with ink, aligned in an X-direction, in a piezoelectric plate of a piezoelectric material;
forming electrode lines with respect to the channel arrays aligned in the Y-direction, each electrode line connecting a plurality of electrodes aligned in the Y-direction, each electrode including drive parts formed on internal walls of each channel and a terminal part which is formed on an external part of each channel and is connected to the drive parts;
applying positive and negative voltages to adjacent electrode lines to cause a polarization of a plurality of partition walls which are aligned in the Y-direction and are present between the adjacent two channels aligned in the X-direction;
cutting the piezoelectric plate in the X-direction into a plurality of channel arrays after the polarization by the voltage applying to form a plurality of printing head elements;
mounting a front plate having a plurality of orifices for jetting the ink onto a front side of each printing head element; and
mounting a back plate having an ink supply path onto a rear side of each printing head element.

8. The method of claim 7, wherein the channels are curved in the X-direction.

9. The method of claim 8, wherein an adjacent electrode line pair to be applied with the positive and negative voltages is selected in order to cause the polarization of all partition walls in the same direction in the X-direction.

10. The method of claim 9, wherein a plurality of adjacent electrode line pairs are simultaneously selected at one time.

11. The method of claim 10, wherein, when a plurality of adjacent electrode line pairs are simultaneously selected, at least one electrode line applied with no voltage is always present between adjacent electrode line pairs.

12. The method of claim 11, wherein the polarization processing by the voltage application is performed at least twice in all partition walls.

* * * * *